United States Patent [19]

Nishi

[11] Patent Number: 4,794,426
[45] Date of Patent: Dec. 27, 1988

[54] ALIGNMENT APPARATUS

[75] Inventor: Kenji Nishi, Kawasaki, Japan

[73] Assignee: Nikon Corporation, Tokyo, Japan

[21] Appl. No.: 123,335

[22] Filed: Nov. 20, 1987

[30] Foreign Application Priority Data

Nov. 26, 1986 [JP] Japan .................................. 61-280973

[51] Int. Cl.$^4$ ........................ G03B 27/42; G03B 27/70
[52] U.S. Cl. ........................................ 355/43; 355/53; 356/400
[58] Field of Search ............................ 355/43, 53, 54; 356/400, 401

[56] References Cited

U.S. PATENT DOCUMENTS 4,402,596  9/1983  Kanatani .............................. 355/43
4,657,379  4/1987  Suwa .................................... 355/43 X Primary Examiner—L. T. Hix
Assistant Examiner—D. Rutledge
Attorney, Agent, or Firm—Shapiro and Shapiro

[57] ABSTRACT

An apparatus for optically aligning a first mark of a substrate and a second mark of a mask formed by a member transmitting radiation therethrough and a member intercepting the radiation includes a stage for supporting the substrate thereon, moving means for two-dimensionally moving the stage, a projection optical system for projecting the pattern of the mask onto the substrate supported on the stage, mark detecting means for optically detecting the first and second marks, the mark detecting means having first application means for applying radiation to the first mark of the substrate through the mask, second application means for applying radiation to the second mark of the mask through the projection optical system, an objective optical system for forming the images of the first and second marks on a predetermined surface, and an optical member. Control means for detecting the deviation between the image of the first mark and the optical member on the basis of the first radiation detection signal to produce a first deviation detection signal, detecting the deviation between the image of the second mark and the optical member on the basis of the second radiation detection signal to produce a second deviation detection signal, and controlling the moving means on the basis of the first and second detection signals.

12 Claims, 6 Drawing Sheets

PRIOR ART

ALIGNMENT APPARATUS

BACKGROUND OF THE INVENTION

1. Field of the Invention

This invention relates to an apparatus for aligning a mask and a substrate (particularly a semiconductor wafer) relative to each other, and in particular to an alignment apparatus suitable for an apparatus for exposing the pattern of a mask to a photosensitive substrate.

2. Related Background Art

In an apparatus for exposing the pattern of a mask to a photosensitive substrate, it is requisite to highly accurately accomplish the work of optically detecting a pattern (or a mark) preformed on the photosensitive substrate and a pattern (or a mark) on the mask and positioning the mask or the photosensitive substrate so that the two patterns (or marks) are correctly superposed one upon the other, that is, the so-called alignment. In recent years, in the field of the exposure apparatus used to make a semiconductor element on a wafer, the stepper which is made into a system for projecting the pattern of a mask onto a small area on a wafer through a projection lens and in which the wafer is caused to effect stepping for the exposure of the whole surface of the wafer has become the main current. This stepper is such that a circuit pattern formed on a reticle as a mask is projected onto a wafer by a projection lens of high resolving power and high N.A. The alignment in the stepper is accomplished by reversely projecting an alignment mark on the wafer onto the reticle side through the projection lens, observing the alignment mark on the reticle and the spatial image of the alignment mark of the wafer (which is formed on the reticle surface) at a time, and detecting the positional deviation between the two marks. In this case, it is usual to design the illuminating light for observing (detecting) the marks so as to enter the projection lens and the wafer through the reticle. The alignment optical system (including the illuminating system) in such a conventional alignment apparatus is described in detail, for example, in U.S. Pat. No. 4,402,596.

Figure 9:
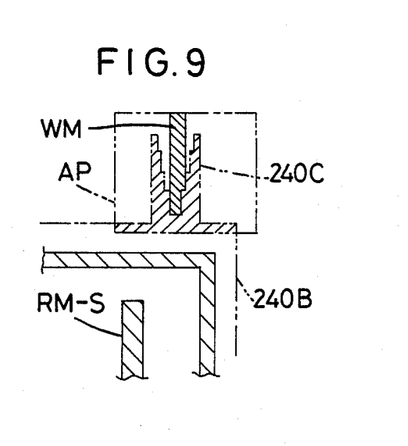
FIG. 9 illustrates the illuminating method during the alignment of the index mark pattern and hhe wafer mark.
Figure 10:
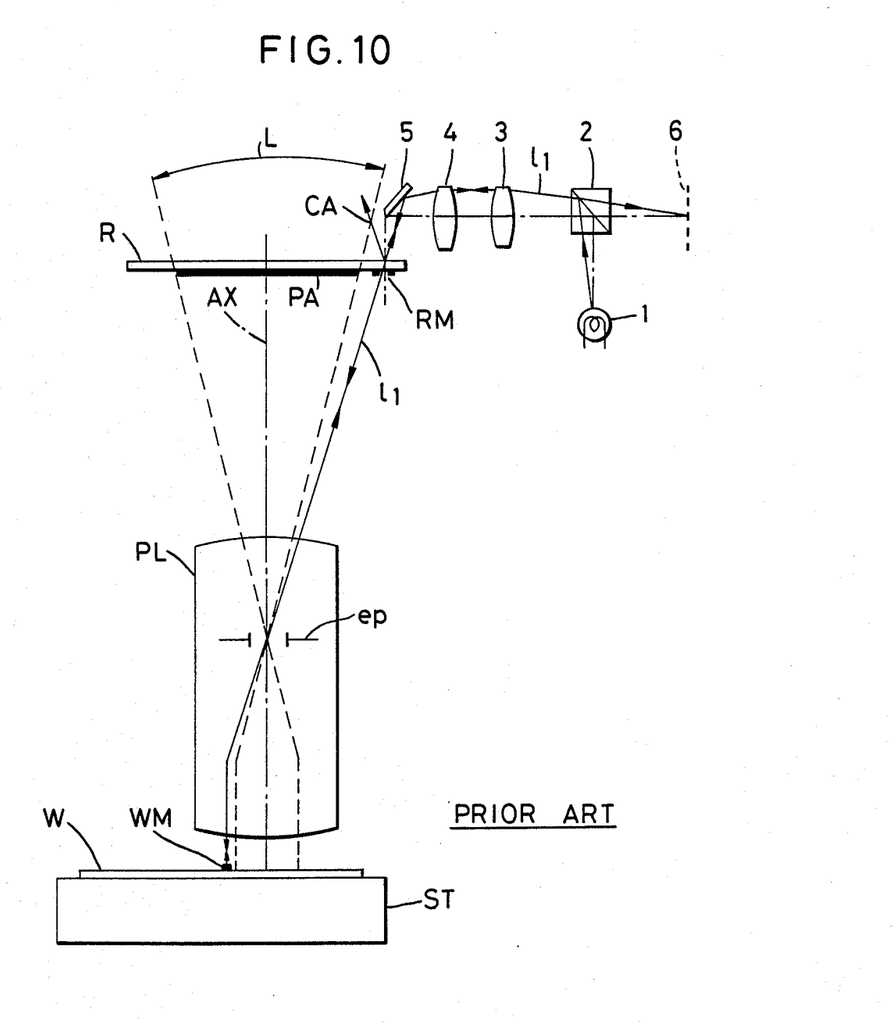
FIG. 10 shows the construction of an apparatus according to the prior art.

The construction of this conventional apparatus is such as shown, for example, in FIG. 9 of the accompanying drawings wherein a projection lens which is telecentric on the wafer W side (the image side) and non-telecentric on the reticle R side (the object side) is used as a projection lens PL. A pattern PA to be superposedly printed on the wafer W and an alignment mark RM are formed on the reticle R. The wafer W is placed on a two-dimensionally movable stage ST, and an alignment mark WM matching the mark RM is formed on the wafer W. In FIG. 9, the light ray L passing through the center of the pupil ep of the projection lens PL represents the principal light ray of the illuminating system for exposure. The alignment system is constituted by a light source 1 as illuminating means, a beam splitter 2, a second objective lens 3, a first objective lens 4 and a total reflection mirror 5 (and further, an illuminating field stop, not shown). The image of the RM of the reticle R is formed on an imaging surface 6 through the objective lenses 4 and 3, and the image of the mark WM of the wafer W is once formed in the same surface as the mark RM of the reticle R through the projection lens PL, whereafter it is again formed on the imaging surface 6 by the objective lenses 3 and 4. The light-receiving surface of an image pickup device such as a television camera is positioned on the imaging surface 6, and the images of both marks RM and WM are photoelectrically detected at a time. In FIG. 9, the line $l_1$ passing through the mark WM of the wafer W, the center of the pupil ep and the mark RM of the reticle R represents the principal light ray of this alignment optical system, and the objective lenses 3 and 4 of this alignment optical system are used eccentrically. The image of the light source 1 may be formed on the pupil ep of the projectinn lens PL.

When, as shown in FIG. 9, the illuminating light for alignment is caused to enter from the opposite side of the projection lens PL with respect to the reticle R and illuminate the mark RM, the illuminating light passed through the transparent portion around the mark RM travels along the principal light ray $l_1$ and illuminates a localized area including the mark WM of the wafer W. Simultaneously therewith, the image of the mark RM is formed on the wafer W. Usually, photoresist is applied to the surface of the wafer W and this surface has reflectivity for the illuminating light for alignment. Therefore, assuming that the localized area including the mark WM is perpendicular to the optic axis AX of the projection lens PL, the principal light ray $l_1$ is parallel to the optic axis AX on the wafer W side and thus, the image of the mark RM formed on the surface of the wafer W is reflected by the wafer W and is reversely projected by the projection lens PL so as to again overlap the mark RM. Of course, the image of the mark WM on the wafer is also formed on the transparent portion aoound the mark RM by the projection lens PL.

Now, the object side (the reticle side) of the projection lens PL is non-telecentric, and by the objective lenses 3 and 4 being used eccentrically, the regularly reflected light on the mark RM travels in the direction of arrow CA and does not return toward the mirror 5 when the Illuminating light from the light source 1 is bent by the mirror 5 and illuminates the mark RM of the reticle R. Such a construction can be realized by obliquely disposing the mirror 5 at an angle of 45° with respect to the surface of the reticle (when the objective lenses 3 and 4 are disposed horizontally) with the fore end portion of the mirror 5 being made substantially coincident with the optic axes of the objective lenses 3 and 4 so that the illuminating light (or the alignment light from the mark may pass through the half area of the objective lenses 3 and 4. Thus, the mark RM of the reticle R is illuminated by the reflected light of the illuminating light for alignment reflected by the wafer W and, if the pattern of the mark RM is of a light-intercepting property, the mark RM is imaged as a dark portion on the image pickup device.

However, paying attention to the image of the mark RM formed on the imaging surface 6, this image is in some cases formed by two images of different properties (but of the same shape) being superposed one upon the other. Assuming here that the off-axis aberration of the projection lens PL is ideally zero and that the localized area including the mark WM of the wafer W is an ideal reflecting plane perfectly perpendicular to the principal light ray $l_1$, the image of the mark RM formed on the wafer W is reflected by the wafer W and is reimaged at a position whereat it accurately overlap the mark RM. Therefore, an image equal to the image formed when the mark RM of the reticle R is simply illuminated is sharply formed on the imaging surface 6 with good contrast, and thus, during the alignmnnt thereof with the mark WM on the wafer, the pattern edge of the mark RM can be detected precisely. Actually, however, the ideal conditions as supposed above do not exist, and if the aberration of the projection lens PL and the inclination of the surface of the wafer W with respect to the optic axis of the projection lens PL deviate greatly from the ideal conditions, the reversely projected image of the image of the mark WM of the wafer W onto the reticle R will become bad in contrast and will not accurately overlap the mark RM. Therefore, the pattern edge of the mark will become unclear, and this has led to the problem that the mark detection accuracy during alignment is reduced. The dual image as described above has readily appeared particularly when the reticle R and the wafer W are not accurately conjugate (in-focus) with respect to the projection lens PL or when the telecentricity of the alignment system including the projection lens goes slightly wrong. There has also been the problem that the images of the mark RM and the mark WM overlap each other and the two images cannot be discriminated from each other with a result that much time is required for alignment.

SUMMARY OF THE INVENTION

It is an object of the present invention to provide a projection exposure apparatus which is capable of accomplishing alignment of a substrate and a reticle without being affected by the aberration of a projection lens, the non-uniformity of the surface of the substrate, etc.

In accordance with the present invention, there is provided illuminating means for illuminating a first mark formed on a substrate which is a first plate and a second mark formed on a mask which is a second plate. There is also provided an objective optical system for forming the image of the first mark or the second mark on a predetermined imaging surface, and is further provided an index mark member having a reflective light-intercepting portion on the predetermined imaging surface or at a position conjugate therewith. This reflective light-intercepting portion transmits therethrough the image light from the first mark and reflects the image light from the second mark.

The image of the first mark and the index mark member are optically detected at a time, and further the image of the second mark and the index mark member are optically detected at a time, whereby the positional deviation between the mask and the substrate may be detected.

In the present invention, by the above-described construction, a reticle is aligned with an index mark pattern, whereafter a wafer is aligned with the index mark pattern, whereby alignment of the reticle and the wafer is accomplished, and when the mark of the reticle is to be observed (or detected), the transmitted illumination by the reflected light from the wafer (or a reflective object replacing it) is not used, thereby enhancing the mark detection accuracy.

DESCRIPTION OF THE PREFERRED EMBODIMENTS

Figure 1:
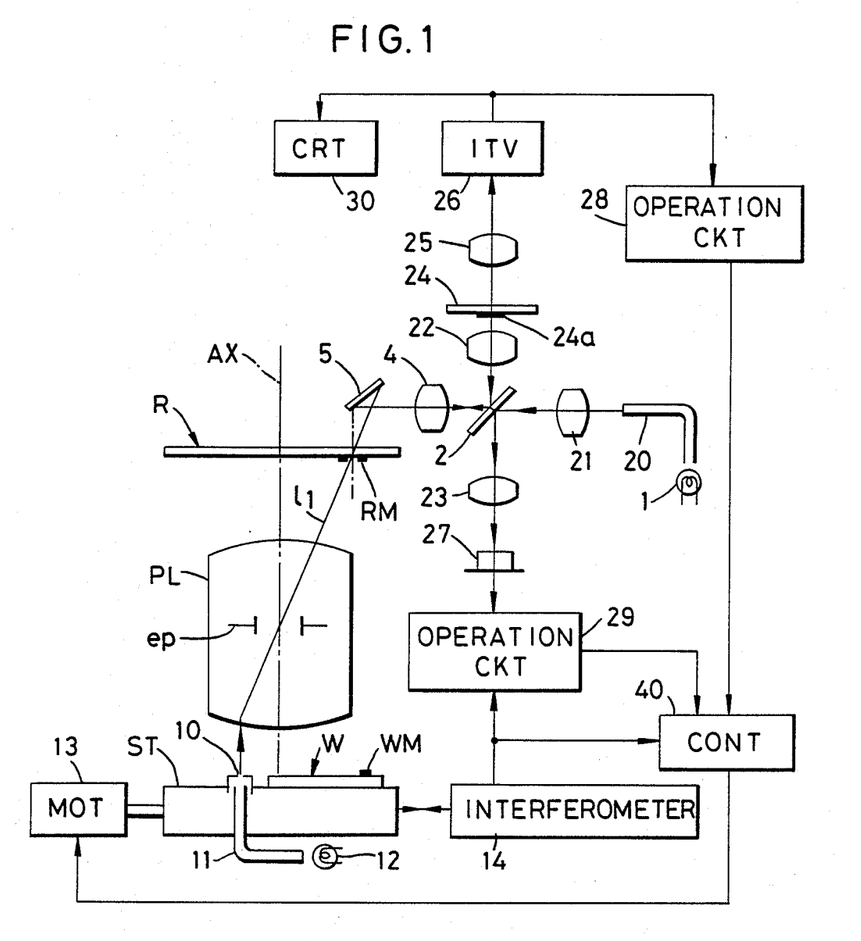
FIG. 1 shows the general construction of an alignment apparatus according to an embodiment of the present invention.

FIG. 1 shows the construction of an alignment apparatus according to an embodiment of the present invention as it is applied to a projection type exposure apparatus. In FIG. 1, portions similar in function and effect to the constituent portions shown in FIG. 9 are given similar reference numerals and symbols. In the present embodiment, a reference slit plate 10 provided with a slit is provided on a stage ST. The surface of the slit plate 10 is defined so as to be substantially flush with the surface of a wafer W. This slit plate 10 is illuminated from the back thereof by a radiation source 12 through an optical fiber 11. In the present embodiment, the wavelength of the illuminating light of the radiation source 12 is the same as the wavelength of the light of the radiation source 1, and is further the same as the wavelength of the illuminating light for exposure. The stage ST is two-dimensionally moved by a motor 13 with the wafer W and the slit 10 being held thereon. The coordinates position of the stage ST is detected by an interferometer 14 which measures by a laser light. The interferometer 14 outputs a pulse signal each time the stage ST is moved by a unit amount. Now, the alignment system of the present embodiment is designed so as to form the image of the exit end (secondary radiation source) of an optical fiber 20 on the pupil ep of a projection lens PL by a lens system 21 and an objective lens 4. In the present embodiment, a beam splitter 2 is constituted by a half-mirror, and lens systems 22 and 23 are disposed with the beam splitter 2 interposed therebetween. The lens system 22 receives the image light rays from marks RM and WM reflected by the beam splitter 2 through the objective lens 4 and images those light rays on an index mark plate 24. That is, the index mark plate 24 is disposed so as to be conjugate with a reticle R with respect to the composite system of the objective lens 4 and the lens system 22. The index mark plate 24 is formed with an index mark pattern 24a which is provided by a reflective light-intercepting portion. An imaging lens 25 forms the image of the index mark pattern 24a on the light-receiving surface of an image pickup tube 26 such as ITV. The lens system 23 is disposed on the side opposite to the lens system 22 with respect to the beam splitter 2, while the system including the lens system 22, the beam splitter 2 and the lens system 23 is defined so that a light-receiving element 27 and the index mark pattern 24a are in a conjugate relation with each other. Now, the image signal from the image pickup tube 26 is input to an operation circuit 28, which electrially detects the positional relation between the index mark pattern 24a and the mark WM of the wafer W and outputs to a main control device 40 the information corresponding to the positional deviation therebetween. Also, the photoelectric signal from the light-receiving element 27 is input to an operation circuit 29, which electrically detects the positional relation between the mark RM and the index mark pattern 24a by moving the slit-like light-emitting portion of the slit plate 10, detects the positional deviation information thereof on the basis of the pulse signal from the interferometer 14 and outputs it to the main control device 40. The main control device 40 controls the driving of the motor 13 on the basis of the input of the coordinates information from the interferometer 14 and moves the stage ST to a desired position. The images of the index mark pattern 24a and the mark WM picked up by the image pickup tube 26 are displayed by a Braun tube (CRT) 30 and used for visual confirmation. Also, the radiation sources 1 and 12 may be used with the radiation source for exposure and may be drawn around by the fibers 11 and 20, respectively. Further, the light emission of the radiation source 1 and of the radiation source 12 is alternatively effected by the main control device 40.

Figure 2A:
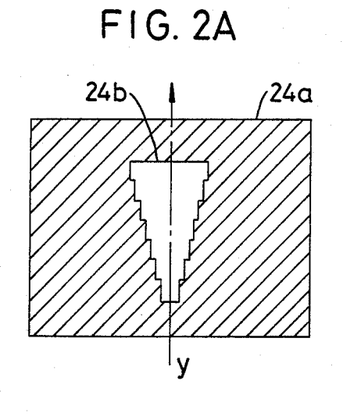
FIG. 2A is a plan view showing the shape of an index mark pattern.
Figure 2B:
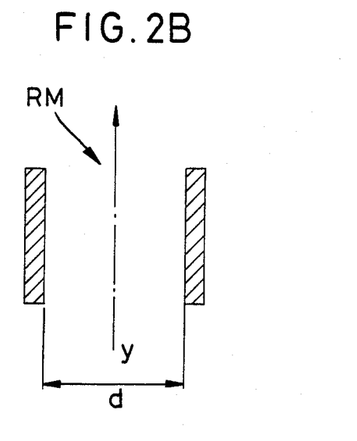
FIG. 2B is a plan view showing the shape of the mark of a reticle.

Now, the shapes of the index mark pattern 24a of the index mark plate 24 and the mark RM of the reticle R are defined as shown, for example, in FIGS. 2A and 2B. FIG. 2A is a plan view of the index mark pattern 24a as seen from the image pickup tube 26 side, and the back side (the lens system 22 side) of the hatching portion is a reflective light-intercepting portion (a reflective chromium layer). In FIG. 2A, when the axis extending toward the center of the reticle R (corresponding to the optic axis AX) is the y-axis, the center line of the index mark pattern 24a lies on the y-axis and a transparent portion 24b of a shape symmetrical with respect to the center line is formed in the pattern 24a. The transparent portion 24b is for observing or detecting the bar-like mark WM on the wafer W therethrough, and has edge portions stepwisely formed with slight amounts of level differences so as to readily permit any positional deviation to be visually confirmed when the mark WM is sandwiched therebetween. In contrast, the mark RM of the reticle R comprises two parallel bar patterns with the y-axis interposed therebetween, as shown in FIG. 2B, and the spacing d therebetween is greater than the width of the transparent portion 24b of the index mark pattern 24a in the x direction (the direction orthogonal to the y-axis). Accordingly, in a state in which the reticle R has been acculately aligned relative to the apparatus, the mark RM is shielded from light by the index mark pattern 24a so that it cannot be observed at all from the image pickup tube 26 side.

Figure 3:
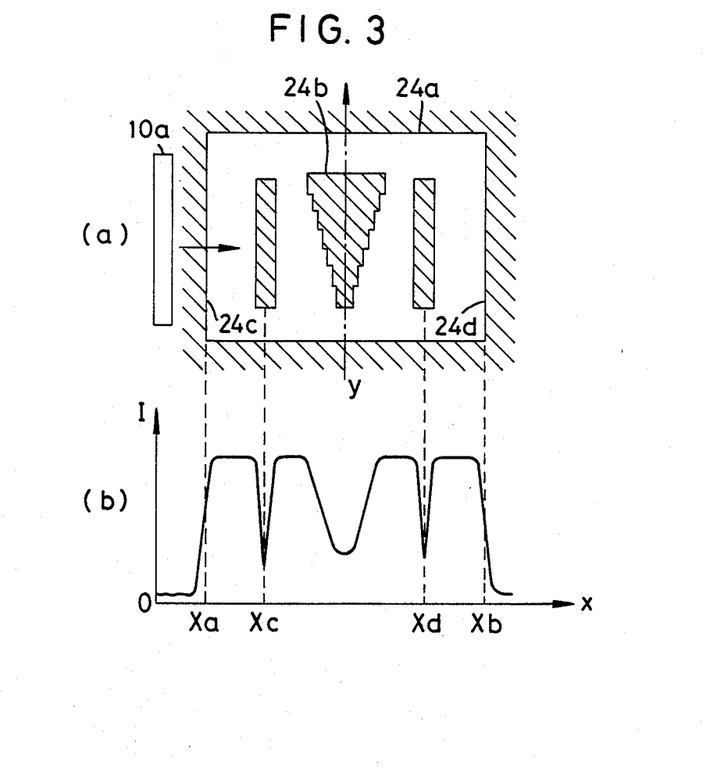
FIG. 3 shows the manner of alignment of the index mark pattern and the reticle mark and the waveform of a photoelectric signal.

Description will now be made of the alignment operation of the apparatus of the present embodiment, particularly, the reticle-wafer alignment operation of the TTR (through-the-reticle) type. It is to be understood here that the reticle R has been positioned relative to the apparatus by the use, for example, of other microscope or the like exclusively for use for reticle alignment. The radiation source 12 is first turned on, and then the stage ST is moved so that the light-emitting slit of the slit plate 10 comes close to the projected position of the mark RM of the reticle R. Then, as shown in FIG. 3(a), the light-emitting slit 10a is scanned in the x direction. FIG. 3(a) is a plan view of the index mark plate 24 as seen from the lens system 22 side. In FIG. 3(a), the white portion represents a portion in which the light reflected by the index mark pattern 24a reaches the beam splitter 2, the lens system 23 and the light-receiving element 27. When the light-emitting slit 10a is positioned outside the index mark pattern 24a as shown, the image of the light-emitting slit 10a is formed on the transparent portion around the mark RM of the reticle R and also is transmitted therethrough and formed on the transparent portion of the index mark plate 24. Therefore, the image light from the light-emitting slit 10a does not reach the light-receiving element 27. When the scanning of the light-emitting slit 10a progresses and the image of the light-emitting slit 10a is formed on the transparent portion around the mark RM of the reticle R and also is formed on the light-intercepting portion of the index mark pattern 24a, the reflected image of the light-emitting slit 10a by the index mark pattern 24a is formed on the light-receiving surface of the light-receiving element 27 through the lens system 22, the beam splitter 2 and the lens system 23. Further, when the image of the light-emitting slit 10a overlaps the bar pattern of the mark RM, the quantity of image light transmitted through the reticle R and reaching the index mark pattern 24a becomes smaller and therefore, the quantity of reflected light is also reduced and the level of the photoelectric signal of the light-receiving element 27 also becomes smaller.

So, in relation to the position in which the light-emitting slit 10a scans, the operation circuit 29 receives as an input the photoelectric signal I from the light-receiving element 27 as shown in FIG. 3(b). In FIG. 3(b), the ordinate represents the level of the photoelectric signal I and the abscissa represents the position of the light-emitting slit 10a in the x direction. At a position Xa, the image of the light-emitting slit 10a crosses the outer edge 24c of the index mark pattern 24a and therefore the level of the photoelectric signal I rises, whereafter at positions Xc and Xd, said level assumes the bottom for the mark RM and at a position Xb, said image crosses the outer edge 24d of the index mark pattern 24a and therefore said level falls. The operation circuit 29 digitally samples the photoelectric signal I in response to the pulse signal from the interferometer 14, detects the positions Xa, Xb, Xc and Xd on the basis of the waveform thereof and calculates the amount of offset $\Delta R$ between the mark RM and the index mark pattern 24a on the basis of the following equation (1):

$$\Delta R = (Xa + Xb)/2 - (Xc + Xd)/2 \qquad (1)$$

Subsequently, the light emission of the radiation source 12 is stopped and the shot area on the wafer W to be exposed is positioned just beneath the projection lens PL. At this time, the mark RM of the reticle R and the mark WM of the wafer W are positioned with the accuracy within approximately 1 $\mu$m, but the radiation source 1 is turned on to effect more precise alignment. Thereby, the localized area including the mark WM of the wafer W is illuminated through the mark RM, and the inversely projected image of the mark WM is formed between the two bar patterns of the mark RM and further formed on the transparent portion 24b of the index mark pattern 24a. Accordingly, the index mark pattern 24a picked up by the image pickup tube 26 and the mark WM of the wafer assume such a relation as shown in FIG. 4, and the mark RM is shielded from light by the index mark pattern 24a and cannot be seen at all.

Figure 4:
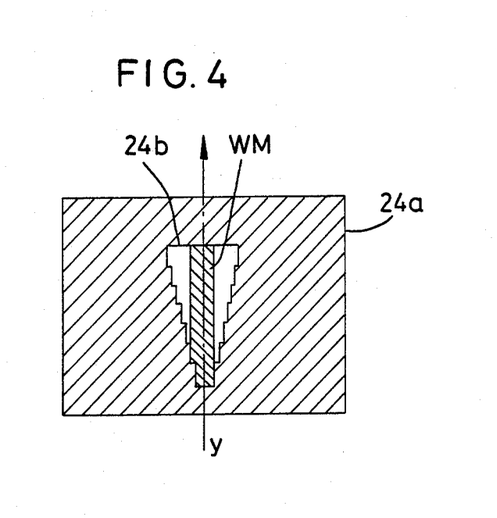
FIG. 4 shows the manner of alignment of the index mark pattern and the mark of a wafer.

Since the image as shown in FIG. 4 is displayed on the CRT 30, the operator finely moves the stage ST so that the mark WM comes to lie just at the center of the transparent portion 24b while watching the displayed image. At a point of time whereat the alignment of the mark WM and the index mark pattern 24a has been completed, the main control device 40 temporarily stores therein the then coordinates position of the stage ST. If the stage ST is fed to this stored position by a distance corresponding to the previously detected amount of offset ΔR, the mark WM of the wafer W and the mark RM of the reticle R are indirectly aligned.

Figure 5:
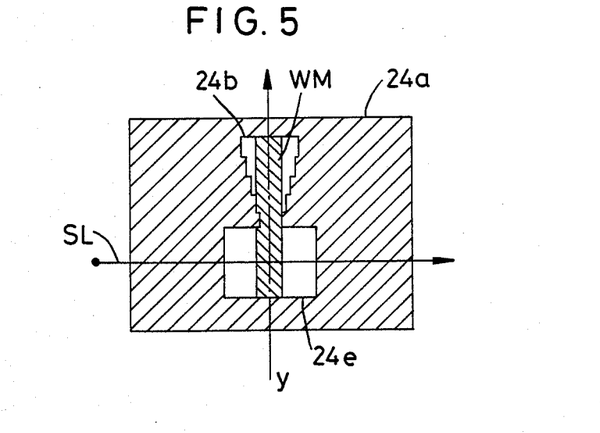
FIG. 5 is a plan view showing the shape of the index mark according to another embodiment.

As described above, in the present embodiment, manual alignment based on visual observation is adopted with regard to the wafer W, but this portion can also be automatized. For this purpose, the shape of the index mark pattern 24a may be changed a little and the image signal from the image pickup tube 26 may be electrically processed by the operation circuit 28, whereby the positional deviation between the index mark pattern and the mark WM may be detected. FIG. 5 is a plan view showing an example of the then shape of the index mark pattern 24a. A rectangular transparent portion 24e is provided below a transparent portion 24b for visual observation. A straight edge portion orthogonal to the scanning line SL of this transparent portion 24e and the edge portion of the mark WM are utilized for alignment. The scanning line SL corresponds to the locus of the photoelectric scanning of the image pickup tube 26, and the operation circuit 28 receives as an input an image signal corresponding to the scanning line SL and automatically measures the amount of deviation ΔW between the transparent portion 24e and the mark WM in the x direction. When the position of the stage ST when this amount of deviation ΔW has been detected is the current position, if the stage ST is fed in from the current position by an amount corresponding to the difference between the previously found amount of offset ΔR and the amount of deviation ΔW, the mark RM of the reticle R and the mark WM of the wafer W are indirectly aligned. When the position of the mark WM is to be thus automatically detected, the work of once driving the mark WM into the center of the transparent portion 24b as during the visual observation becomes unnecessary. The above-described operation is controlled by the main control device 40 having a microcomputer contained therein, and such operation is shown in the flow chart of FIG. 6.

Figure 6:
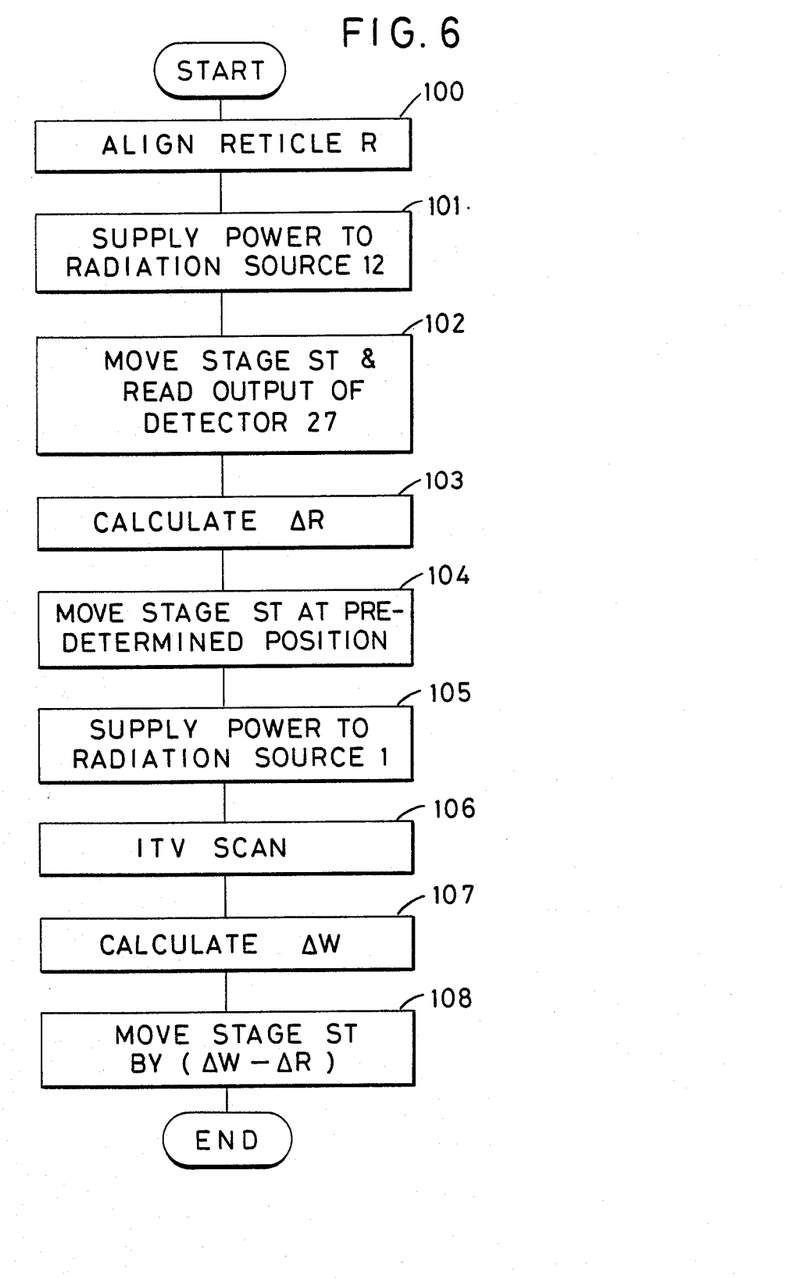
FIG. 6 is a flow chart showing the operation of the apparatus according to the embodiment of the present invention.

At step 100 in FIG. 6, the reticle R is positioned at a predetermined position with respect to the apparatus of the present embodiment by conventional means. At step 101, the main control device 40 causes electric power to be supplied to the radiation source 12, and at step 102, the main control device 40 samples the output of the detector 27 on the basis of the signal of the interferometer 14 while moving the stage ST and stores it in the internal memory in the device 40. At seep 103, the aforementioned ΔR is calculated on the basis of the sampled output of the detector in the internal memory. At step 104, the stage ST is moved and placed at a predetermined position at which the mark WM can be observed through the transparent portion 24a as shown in FIG. 4. At step 105, electric power is supplied to the radiation source 1 instead of to the radiation source 12. At step 106, the ITV 26 is operated and at step 107, the aforementioned ΔW is calculated. At step 108, the stage ST is moved by (ΔW−ΔR). By the above-described operations, the optical alignment of the mark RM of the reticle R and the mark WM of the wafer W is completed.

In the present embodiment, the light-receiving element for detecting the alignment of the index mark pattern 24a and the mark RM of the reticle R is disposed conjugately with the index mark pattern 24a and the mark RM, but alternatively, it may be disposed conjugately with respect to the pupil of the lens system 23 (or the projection lens PL). Further, an image pickup tube may be disposed instead of the light-receiving element being disposed conjugately with the index mark pattern 24a. In such case, two image pickup tubes for alignment will become necessary, but if the image pickup tube 26 in FIG. 1 is changed over or used in a composite view field, only one such tube will be required. To this end, the image light from the lens system 23 can be directed into the optical path between the index mark plate 24 and the image pickup tube 26 by the use of a reflecting mirror or a relay lens so that it may be observed by means of the image pickup tube 26. In such case, the alignment of the index mark pattern 24a and the mark RM of the reticle will be accomplished by the photoelectric scanning of the image pickup tube itself. Therefore, it will not be necessary to scan by the light-emitting slit 10a, but a surface light-emitting portion of a size and shape capable of illuminating the whole of the mark RM and index mark pattern 24a can be provided on the stage ST.

Figure 7A:
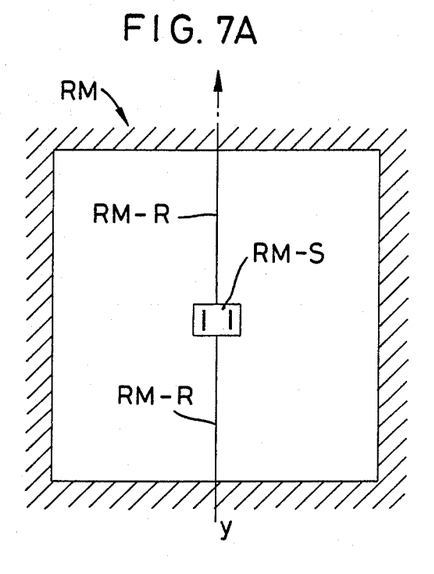
FIG. 7A is a plan view showing another shape of the reticle mark.
Figure 7B:
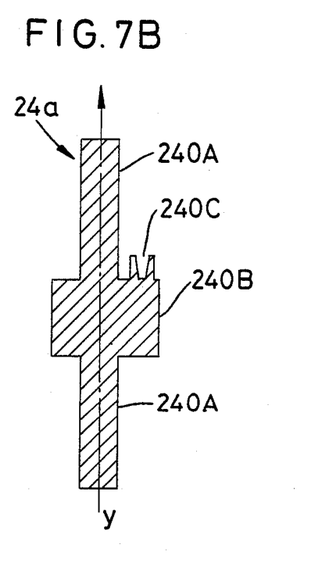
FIG. 7B is a plan view showing the shape of an index mark pattern corresponding to the mark shape of FIG. 7A.
Figure 8:
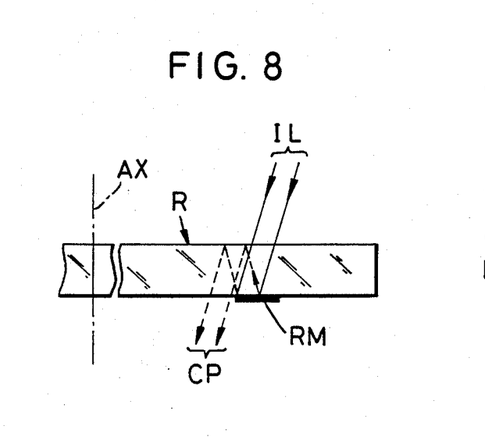
FIG. 8 illustrates the multiplex reflection on the reticle.

Reference is now had to FIGS. 7A and 7B to describe the shapes of the index mark pattern and reticle mark according to another embodiment of the present invention. FIG. 7A is a plan view of the mark RM on the reticle R, and this mark RM is constituted by a long bar-like reticle alignment mark RM-R for aligning the reticle R relative to the apparatus, and a mark RM-S to be used in the same manner as the mark shown in FIG. 2B. FIG. 7B is a plan view showing the index mark pattern 24a corresponding to these marks RM. The index mark pattern 24a is formed by portion 240A for shielding the mark RM-R, a portion 240B for shielding the mark RM-S, and a nipping mark portion 240C used during the alignment with the mark WM of the wafer W. The surroundings of these portions 240A, 240B and 240C are all transparent. Where such a reticle is used, in an apparatus wherein a field stop is provided in an illuminating optical system so that the illuminating light from the radiation source 1 may illuminate only the localized portion including the mark RM-S, the mark WM on the wafer W and the mark RM-S are observed at a time. If at this time, the projection lens PL is non-telecentric on the object side, there has arisen the problem as shown in FIG. 8. Usually, the mark RM formed on the reticle R is deposited by evaporation on the side opposite to the incidence side of the illuminating light IL. If the object side of the projection lens PL is non-telecentric, the principal light ray will become oblique and thus, part of the illuminating light regularly reflected by the mark RM is re-reflected by the upper surface of the interior of the reticle R and it passes through the marginal transparent portion CP of the mark RM near the optic axis AX and reaches the wafer W. Therefore, it has heretofore happened that unexpected stray light is applied to the vicinity of the mark WM on the wafer to be aligned with the mark RM. So, as in the present embodiment, the mark portion 240c of the index mark pattern 24a is defined so as to lie in the transparent portion on the reticle R and, when the mark WM on the wafer W is to be observed, the range of irradiation can be defined so as to be limited to the area AP including only the mark portion 240c as shown in FIG. 9 by the field stop in the illuminating optical system. Thus, it does not happen that as in the previous first embodiment, the illuminating light for observing the mark WM of the wafer illuminates the mark RM of the reticle R and therefore, unexpected stray light is prevented from being applied onto the wafer. Again in the present embodiment, the relation between the reticle R and the index mark pattern 24a is detected by scanning the light-emitting slit 10a, but as is apparent from the shape of the pattern of FIGS. 7A and 7B, such detection is accomplished by detecting the positional relation in the x direction between the mark RM-R and the reflective light-intercepting portion 240A as the amount of offset.

Of the marks RM of the reticle R shown in FIG. 7A, the mark RM-S may be deleted to provide an entirely transparent portion. In that case, the mark portion 240c of the index mark pattern 24a can be provided centrally of the shielding portion 240B, and the mark RM-R and the wafer mark WM when the alignment of the reticle and the wafer has been accomplished are substantially at the same position and the error during the detection of each mark becomes minimum.

Also, as the exposure apparatus, in an apparatus wherein only the mark on the wafer is detected through the projection lens PL or an apparatus provided with an off-axis type wafer alignment sensor for detecting the mark of the wafer independently of the projection lens PL, it is requisite to measure the relative distance between the mark detection center position by the wafer alignment sensor and the pattern projection center point of the reticle R, the so-called base line. In the measurement of this base line, a reference mark of the same shape as the mark WM of the wafer may be provided on the surface of the slit plate 10, and the relative distance between the position of the stage ST when the reference mark and the index mark pattern 24a have been aligned and the position of the stage ST when the reference mark has been detected by the off-axis type wafer alignment sensor may be measured. When the off-axis type wafer alignment sensor is designed so as to be capable of photoelectrically detect the light-emitting slit 10a, the reference mark need not be provided in particular. In such case, however, it is necessary to observe the index mark pattern 24a and the light-emitting slit 10a at a time.

Now, the radiation sources 1 and 12 shown in FIG. 1 may be ones which produce lights of different wavelengths from the exposure light. Particularly, if the illuminating light from the radiation source 1 is of a wavelength which will not sensitize the photoresist of the wafer and the illuminating light from the radiation source 12 is of the same wavelength as the exposure light, it will be advantageous in that the mark WM on the wafer is not sensitized and is therefore protected. In this case, the objective lens 4, the lens system 22, etc. in the alignment optical system may preferably be achromatized. Also, a transmitting type linear Fresnel pattern may be provided instead of the slit 10a so that a convergent light beam of linear cross-section (a sheet-like spot light) may be formed in a space distant from the surface of the linear Fresnel pattern by the inherent focal length thereof and this spot light may be imaged on the pattern surface of the reticle R or on the index mark pattern, whereby a similar effect may be obtained. In such case, if the inherent focal length of the linear Fresnel pattern is made to correspond to the amount of chromatic aberration of the projection lens, it will be advantageous when use is made of an alignment light of different wavelength from the exposure light.

As described above, according to the present invention, in the TTR (through-the-reticle) type alignment system, the influence of the reflected image of the mark of the mask (reticle) caused when the image side of the projection optical system is telecentric is eliminated and the visibility of the mask mark, especially the contrast of the edge, is enhanced with a result that improved alignment accuracy can be expected.

I claim:

1. An apparatus for optically aligning a first mark of a substrate and a second mark of a mask formed by a member transmitting radiation therethrough and a member intercepting the radiation, including:
    (a) stage means for supporting said substrate thereon;
    (b) moving means for two-dimensionally moving said stage means;
    (c) a projection optical system for projecting the pattern of said mask onto said substrate supported on said stage means;
    (d) mark detecting means for optically detecting said first and second marks, said mark detecting means having first application means for applying radiation to said first mark of said substrate through said mask, second application means for applying radiation to said second mark of said mask through said projection optical system, an objective optical system for forming the images of said first and second marks on a predetermined surface, and an optical member comprised of a member transmitting the radiation therethrough and a member reflecting the radiation and disposed so as to be substantially coincident with said predetermined surface, said mark detecting means producing a first radiation detection signal conforming to the radiation from said first mark passed through said optical member and producing a second radiation detection signal conforming to the radiation from said second mark reflected by said optical member; and
    (e) control means for detecting the deviation between the image of said first mark and said optical member on the basis of said first radiation detection signal to produce a first deviation detection signal, detecting the deviation between the image of said second mark and said optical member on the basis of said second radiation detection signal to produce a second deviation detection signal, and controlling said moving means on the basis of said first and second detection signals.

2. An apparatus according to claim 1 wherein said control means controls said moving means on the basis of said first and second deviation detection signals so that the deviation between the images of said first and second marks on said predetermined surface becomes null.

3. An apparatus according to claim 2, wherein said first deviation detection signal is indicative of the amount of deviation between the image of said first mark and said optical member in a predetermined direction, said second deviation detection signal is indicative of the amount of deviation between the image of said second mark and said optical member in said predetermined direction, and said control means moves said moving means along said predetermined direction so that on said predetermined surface, the images of said first and second marks assume a predetermined positional relation with each other.

4. An apparatus according to claim 3, wherein said first application means is provided on said stage means.

5. An apparatus according to claim 4, wherein said first application means has a light-intercepting member formed with a slit-like opening extending in a direction intersecting a direction corresponding to said predetermined direction and a radiation source, said light-intercepting member being disposed between said radiation source and said projection optical system, and the image of said opening is formed on said mask by said projection optical system.

6. An apparatus according to claim 4, wherein said mark detecting means has first radiation detecting means for detecting the intensity of the radiation from said first mark passed through said optical member, and second radiation detecting means for detecting the intensity of the radiation from said second mark reflected by said optical member, and said control means moves said stage means along a direction corresponding to said predetermined direction, and produces said second radiation detection signal in accordance with the output of said second radiation detecting means produced during the movement of said stage means.

7. An apparatus according to claim 6, wherein said optical member is designed so as to transmit therethrough the radiation conforming to said first mark and not to transmit therethrough the radiation conforming to said second mark.

8. An apparatus according to claim 1, wherein said optical member is designed so as to transmit therethrough the radiation conforming to said first mark and not to transmit therethrough the radiation conforming to said second mark.

9. An apparatus for optically aligning a first mark of a substrate and a second mark of a mask formed by a member transmitting the radiation therethrough and a member intercepting radiation, including:

(a) stage means for supporting said substrate thereon;
(b) a projection optical system for projecting the pattern of said mask onto said substrate supported on said stage means;
(c) mark detecting means for optically detecting said first and second marks, said mark detecting means having first application means for applying radiation to said first mark of said substrate through said mask, second application means for applying radiation to said second mark of said mask through said projection optical system, an objective optical system for forming the images of said first and second marks on a predetermined surface, and an optical member disposed so as to be substantially coincident with said predetermined surface, said optical member being comprised of a member transmitting the radiation therethrough so as to transmit therethrough the radiation conforming to said first mark and reflect the radiation conforming to said second mark and a member reflecting the radiation, said mark detecting means producing a first radiation detection signal conforming to the radiation from said first mark passed through said optical member and producing a second radiation detection signal conforming to the radiation from said second mark reflected by said optical member;

(d) means for detecting the deviation between the image of said first mark and said optical member on the basis of said first radiation detection signal to produce a first deviation detection signal and detecting the deviation between the image of said second mark and said optical member on the basis of said second radiation detection signal to produce a second deviation detection signal; and (e) means for two-dimensionally moving said stage means to eliminate the deviation between the images of said first and second marks on said predetermined surface.

10. An apparatus for optically aligning a first mark of a first plate and a second mark of a second plate, including:

(a) detecting means for optically detecting said first and second marks, said detecting means having application means for applying radiation to said first mark of said first plate and said second mark of said second plate, an objective optical system for forming the images of said first and second marks on a predetermined surface, and an optical member comprised of a member transmitting the radiation therethrough and a member reflecting the radiation and disposed so as to be substantially coincident with said predetermined surface, said detecting means producing a first radiation detection signal conforming to the radiation from said first mark passed through said optical member and producing a second radiation detection signal conforming to the radiation frmm said second mark reflected by said optical member; and (b) displacing means for detecting the deviation between the image of said first mark and said optical member on the basis of said first radiation detection signal to produce a first deviation detection signal, detecting the deviation between the image of said second mark and said optical member on the basis of said second radiation detection signal to produce a second deviation detection signal, and imparting relative displacement to between said first plate and second plate on the basis of said first and second deviation detection signals.

11. An apparatus according to claim 10, wherein said displacing means imparts relative displacement to between said firtt plate and said second plate so as to eliminate the deviation between the images of said first and second marks on said predetermined surface.

12. An apparatus according to claim 11, wherein said optical member is designed so as to transmit therethrough the radiation conforming to said first mark and not to transmit therethrough the radiation conforming to said second mark.

* * * * *